(12) United States Patent
Yoshida

(10) Patent No.: US 6,392,933 B1
(45) Date of Patent: May 21, 2002

(54) EEPROM ERASING METHOD

(75) Inventor: Takuji Yoshida, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/680,315

(22) Filed: Oct. 6, 2000

Related U.S. Application Data

(63) Continuation of application No. 08/450,553, filed on May 25, 1995, which is a continuation of application No. 07/757,927, filed on Sep. 12, 1991, now Pat. No. 5,267,209.

(30) Foreign Application Priority Data

Sep. 14, 1990 (JP) .............................................. 2-242728

(51) Int. Cl.[7] .............................................. G11C 16/04
(52) U.S. Cl. .............................. 365/185.29; 365/185.18
(58) Field of Search ........................ 365/185.29, 185.18, 365/218, 189.09, 185.33

(56) References Cited

U.S. PATENT DOCUMENTS

| | | |
|---|---|---|
| 4,503,524 A | 3/1985 | McElroy |
| 4,769,787 A | 9/1988 | Furusawa et al. |

(List continued on next page.)

FOREIGN PATENT DOCUMENTS

| | | |
|---|---|---|
| EP | 0 320 231 | 6/1989 |
| JP | 5494 | 1/1984 |
| JP | 62-099997 | 5/1987 |
| JP | 63-188896 | 8/1988 |
| JP | 01-021795 | 1/1989 |
| JP | 52300 | 2/1989 |
| JP | 01-105397 | 4/1989 |
| JP | 01-289282 | 11/1989 |

OTHER PUBLICATIONS

D'Arrigo et al., 1989 IEEE International Solid–State Circuits Conference, pp. 132–133; Session 10: Non–Volatile Memories; Tham 10.3: "A 5V–Only 256k Bit CMOS Flash EEPROM."

N. Anantha et al., Electrically Erasable Floating Gate F.E.T. Mem. Cell, IBM Tech. Discl. Bull., vol. 17, No. 8, Jan. 1975, pp. 2311–2313.

R. Dockerty, Nonvol. Mem. Array w. Single Famos Dev. Per Cell, IBM Tech. Discl. Bull., vol. 17, No. 8, Jan. 1975, pp. 2314–2315.

M. Kikuchi et al., A 2047–Bit–N–Channel Fully Decoded Electrically Writable/Erasable Nonvol. R.O.M., 1$^{st}$European Solid State Circuits Conf. (ESSIRC) Kent, England, Sep. 2–5, 1975, 1 pp. 66–67.

Haddad, et al., "Degradations Due to Hole Trapping in Flash Memory Cells", IEEE Electron Device Letters, vol. 10, Mar. 1989, pp. 117–119.

*Primary Examiner*—A. Zarabian
(74) *Attorney, Agent, or Firm*—Venable; Robert Kinberg

(57) ABSTRACT

An electrically erasable programmable read-only memory receives a single supply voltage and a ground voltage, and generates a first voltage higher than both the supply voltage and the ground voltage, and a second voltage lower than both the supply voltage and the ground voltage. Each memory cell in the memory has a nonvolatile storage transistor with a floating gate. To erase the memory cell, the first voltage is applied on a, first side of the floating gate and the second voltage is applied on a second, opposite side of the floating gate. To program the memory cell, the second voltage is applied on the first side of the floating gate, and the first voltage is applied on the second side of the floating gate.

30 Claims, 3 Drawing Sheets

U.S. PATENT DOCUMENTS

| | | |
|---|---|---|
| 4,823,318 A | 4/1989 | D'Arrigo et al. |
| 4,953,928 A | 9/1990 | Anderson et al. |
| 5,003,510 A | 3/1991 | Kamisaki |
| 5,022,000 A | 6/1991 | Terasawa et al. |
| 5,047,981 A | 9/1991 | Gill et al. |
| 5,077,691 A | 12/1991 | Haddad et al. |
| 5,122,985 A | 6/1992 | Santin |
| 5,134,449 A | 7/1992 | Gill et al. |
| 5,146,106 A | 9/1992 | Anderson et al. |
| 5,155,701 A | 10/1992 | Komori et al. |
| 5,168,335 A | 12/1992 | D'Arrigo et al. |
| 5,177,705 A | 1/1993 | McElroy et al. |
| 5,187,683 A | 2/1993 | Gill et al. |
| 5,235,544 A | 10/1993 | Caywood |
| 5,265,052 A | 11/1993 | D'Arrigo et al. |
| 5,781,476 A | 7/1998 | Seki et al. |
| 5,844,842 A | 12/1998 | Seki et al. |
| 5,917,752 A | 7/1999 | Seki et al. |
| 5,949,715 A | 9/1999 | Seki et al. |
| 5,959,894 A | 9/1999 | Seki et al. |
| 5,991,200 A | 9/1999 | Seki et al. |
| 6,016,273 A | 1/2000 | Seki et al. |

EEPROM ERASING METHOD

CROSS-REFERENCE TO RELATED APPLICATIONS

This application is a continuation of application Ser. No. 08/450,553 filed May 25, 1995, which was a continuation of application Ser. No. 07/757,927, filed Sep. 12, 1991, now U.S. Pat. No. 5,267,209.

BACKGROUND OF THE INVENTION

The electrically erasable programmable read-only memo (hereinafter referred to as EEPROM) has proven useful because it combines the convenience of non-volatile data storage with the capability to erase the stored data electrically, then program new data. The utility of EEPROM has been increased by the development of various types of flash EEPROM, which erase a large number of memory cells simultaneously. There is a strong interest in flash EEPROM with megabit storage capacity for use in devices such as portable computers.

The basic EEPROM memory cell has a field-effect transistor with a control gate and a floating gate. The cell is erased and programmed by producing a potential difference between the control gate and the source or drain large enough to cause Fowler-Nordheim tunneling of electrons into or out of the floating gate. A high voltage required for the tunneling is generated within the EEPROM chip.

For example, one prior-art EEPROM has a charge pump by which it generates 20 V internally, using the potential difference between this voltage and ground (0 V) for erasing and programming. Another prior-art EEPROM has a negative charge pump that generates −15 V internally, using the 20 V potential difference between this and the 5 V supply voltage for erasing and programming. Still another prior-art EEPROM produces 18 V and −11 V internally, using the potential difference between −11 V and the supply voltage (5 V) for erasing and the potential difference between 18 V and ground (0 V) for programming.

A problem with these prior-art EEPROMs is that the transistors that deliver voltages such as 20 V, 18 V, −11 V and −15 V to the memory cell must be large in size. To provide high breakdown voltages, these transistors require deep junctions and thick gate oxides, or increased gate lengths. Occupying excessive space on the EEPROM chip, they make it difficult to attain the high levels of integration desired for many applications.

A related problem is that longer-than-normal wafer processes are needed to fabricate these high-voltage transistors. Thus they add to the time and cost of the EEPROM manufacturing process.

A further problem, particularly in flash EEPROMs that erase all memory cells simultaneously, is that delivery of a high erasing voltage to a memory cell that is already erased can drive the floating gate of the memory cell into a depletion mode, causing the cell to leak and produce false data. Complex schemes have been necessary to avoid such overerasing.

SUMMARY OF THE INVENTION

It is accordingly an object of the present invention to reduce the voltages required for erasing and programming EEPROM memory cells.

Another object of the invention is to reduce the size of driver transistors for EEPROM word lines and bit lines.

Still another object is to reduce the size of select transistors in EEPROM memory cells.

Yet another object is to shorten the EEPROM fabrication process.

A further object is to avoid the problem of overerasing EEPROM memory cells.

The invented method of erasing and programming an EEPROM memory cell uses a supply voltage and a ground voltage to generate a first voltage higher than both the supply voltage and the ground voltage, and a second voltage lower than both the supply voltage and the ground voltage. The memory cell comprises a nonvolatile storage transistor having a floating gate. To erase the memory cell, the first voltage is applied on a first side of the floating gate electrode of the nonvolatile storage transistor and the second voltage is applied on a second side of the floating gate, opposite to the first side. To program the memory cell, the second voltage is applied on the first side of the floating gate, and the first voltage is applied on the second side of the floating gate.

DETAILED DESCRIPTION OF THE INVENTION

Novel methods of erasing and programming EEPROM memory cells, and a novel EEPROM employing these methods, will be described with reference to the drawings. The drawings are intended to illustrate the invention but do not restrict its scope, which should be determined solely from the appended claims. In particular, the invention is not restricted to the voltages shown in Tables 1, 2, 3 and 4 at the end of the specification.

Figure 1:
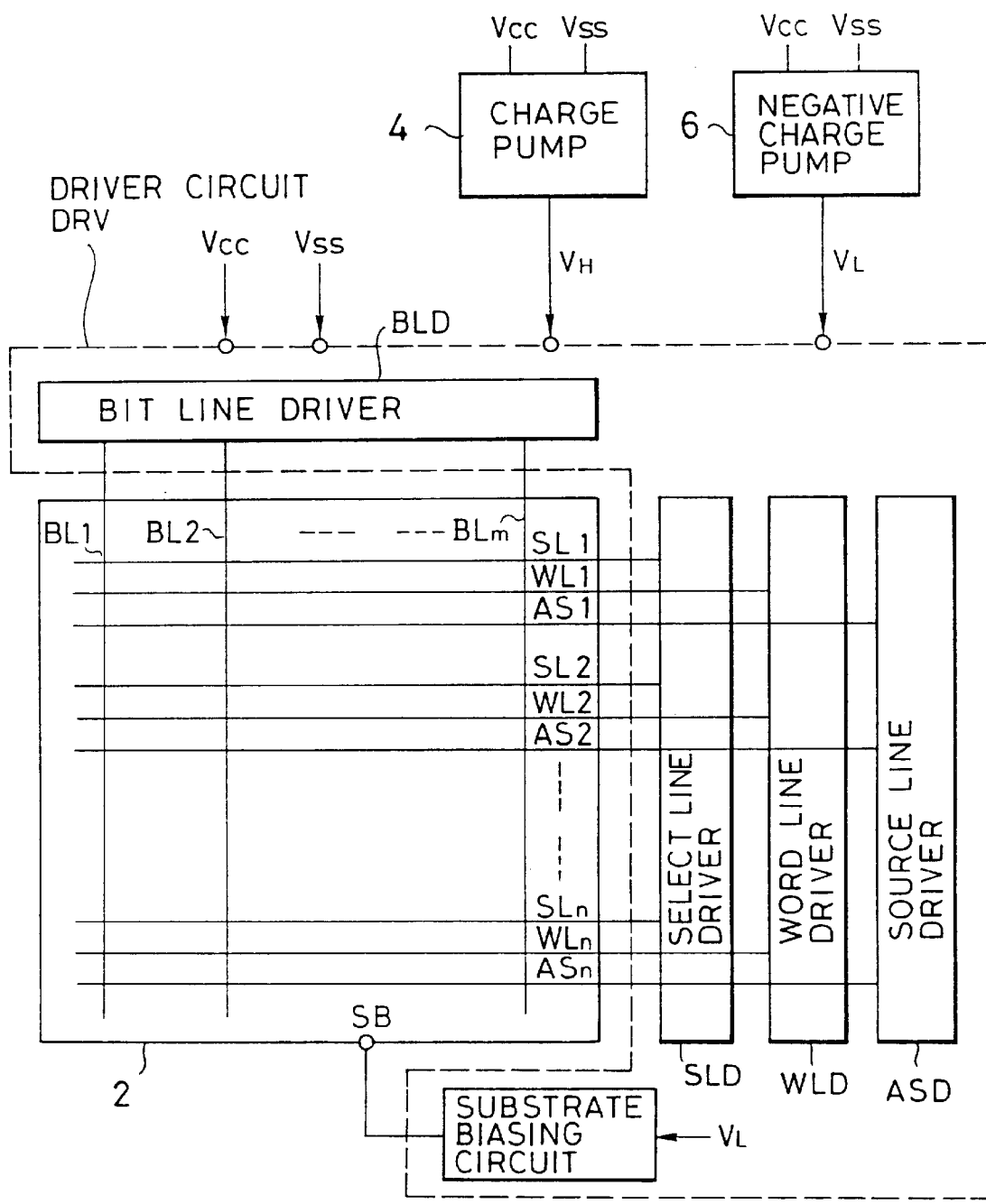
FIG. 1 is a block diagram of an EEPROM using novel methods of erasing and programming.

With reference to FIG. 1, the novel EEPROM comprises a memory cell array 2 having a plurality of memory cells disposed in mutually intersecting rows and columns. The columns are connected to bit lines designated BL1, BL2, . . . , BLm in the drawings. The rows are connected to word lines designated WL1, WL2, . . . , WLn. Select lines SL1, SL2, . . . , SLn and source lines AS1, AS2, . . . , ASn are also connected to the memory cell array 2, paralleling the word lines WL1, WL2, . . . , WLn. The memory cell array 2 is formed on a p-type substrate indicated by the symbol SB.

The novel EEPROM also comprises a charge pump 4 and a negative charge pump 6, both of which receive an externally produced supply voltage $V_{CC}$ and an externally produced ground voltage $V_{SS}$. Conventionally $V_{SS}$ is zero volts and $V_{CC}$ is five volts, although the invention is not restricted to these values. From $V_{CC}$ and $V_{SS}$ the charge pump 4 generates a first voltage $V_H$, higher than both $V_{SS}$ and $V_{CC}$. From $V_{CC}$ and $V_{SS}$ the negative charge pump 6 generates a second voltage $V_L$, lower than both $V_{SS}$ and $V_{CC}$. Charge pumps and negative charge pumps are well known; detailed descriptions of their internal circuitry will be omitted.

The EEPROM further comprises a driver circuit DRV which is coupled to receive the first voltage $V_H$ and the second voltage $V_L$ as well as $V_{CC}$ and $V_{SS}$. The driver circuit DRV is also coupled to the bit lines BL1, . . . , BLm, the word lines WL1, . . . , WLn, the select lines SL1, . . . , SLn, the source lines AS1, . . . , ASn, and the substrate SB, and selectively supplies them with the first voltage $V_H$, the second voltage $V_L$, $V_{CC}$ or $V_{SS}$ or isolates them, causing them to float, as will be later described in detail.

In the illustrated embodiment, the driver circuit DRV includes a bit line driver BLD, a word line driver WLD, a select line driver SLD, a source line driver ASD and a substrate biasing circuit SBB.

The bit line driver BLD is coupled to receive the first voltage $V_H$ as well as $V_{CC}$ and $V_{SS}$. The bit line driver BLD is also coupled to the bit lines BL1, . . . , BLm, and selectively supplies the bit lines with the first voltage $V_H$ or causes the bit lines to float from an initial ground-level voltage ($V_{SS}$=0 V).

The word line driver WLD is coupled to receive the first voltage $V_H$ and the second voltage $V_L$ as well as $V_{CC}$ and $V_{SS}$. The word line driver WLD is also coupled to the word lines WL1, . . . , WLn, and selectively supplies the word lines with the first voltage $V_H$, the second voltage $V_L$ or the ground-level voltage $V_{SS}$.

The select line driver SLD is coupled to receive the first voltage $V_H$ as well as $V_{CC}$ and $V_{SS}$. The select line driver SLD is also coupled to the select lines SL1, . . . , SLn, and selectively supplies the select lines with the first voltage $V_H$ or the ground-level voltage $V_{SS}$.

The source line driver ASD is coupled to receive the second voltage $V_L$ as well as $V_{CC}$ and $V_{SS}$. The source line driver ASD is also coupled to the source lines AS1, . . . , ASn, and selectively supplies the source lines with the second voltage or causes the source lines to float from an initial ground-level voltage.

The substrate biasing circuit SBB is coupled to receive the second voltage $V_L$ as well as $V_{CC}$ and $V_{SS}$. The substrate biasing circuit SBB is also coupled to the substrate SB, and selectively biases the substrate to the second voltage $V_L$ or $V_{SS}$.

The EEPROM in FIG. 1 also comprises sense amplifiers, row and column decoders, and other circuits which are not shown in the drawing but will be familiar to one skilled in the art.

Figure 2:
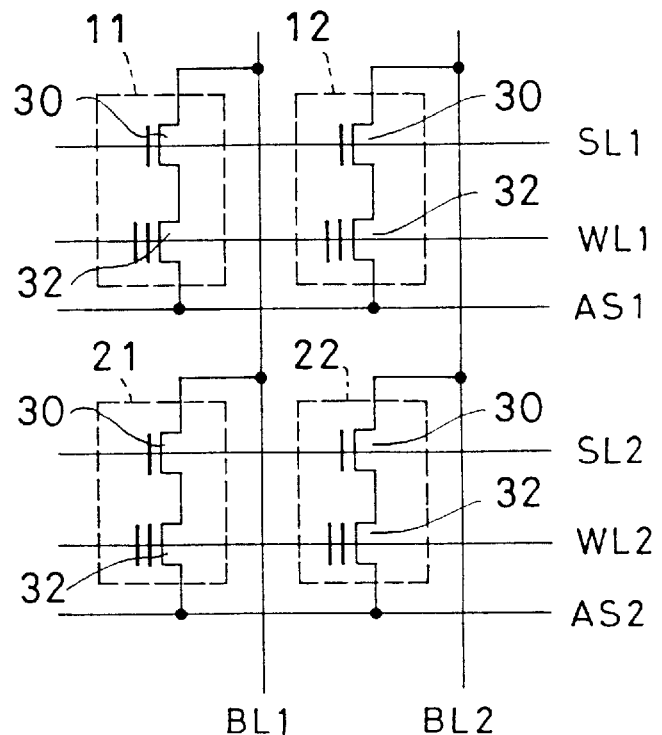
FIG. 2 is a schematic diagram of part of the memory cell array in FIG. 1.

FIG. 2 is a schematic diagram of four memory cells 11, 12, 21, and 22 disposed at the intersections of the first two rows and columns in the memory cell array 2 in FIG. 1. Each memory cell comprises a select transistor 30 and a nonvolatile storage transistor 32 connected in series between a source line and a bit line.

Figure 3:
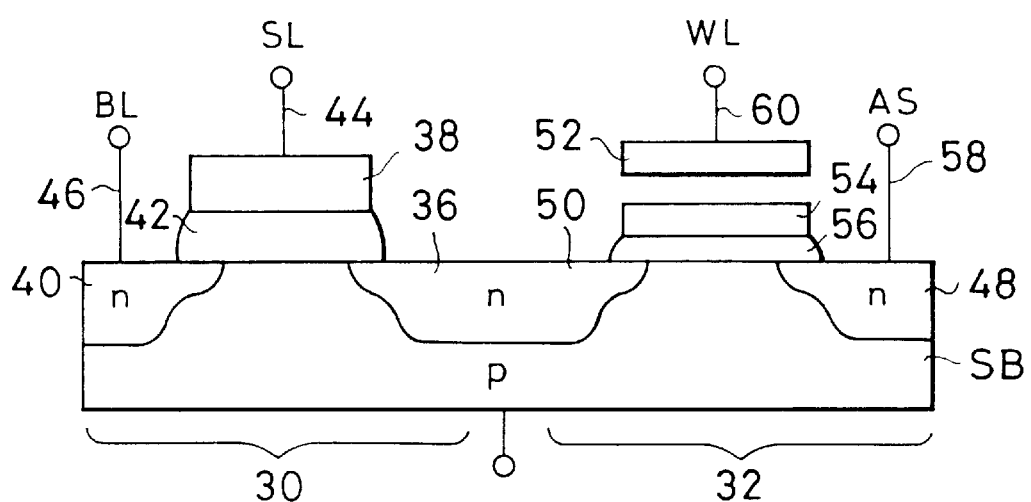
FIG. 3 is a sectional view of a memory cell in FIG. 2.

FIG. 3 is a sectional view of one of the memory cells in the memory cell array 2. The select transistor 30 and storage transistor 32 are both formed on a p-type substrate SB as noted earlier.

The select transistor 30 comprises a source 36, a gate 38, and a drain 40, the gate 38 being separated from the source 36, the drain 40, and the substrate SB by a gate oxide 42. The gate 38 is connected by a gate electrode 44 to a select line SL such as the select line SL1 or SL2 in FIG. 2. The drain 40 is connected by a drain electrode 46 to a bit line BL such as the bit line BL1 or BL2 in FIG. 2.

The storage transistor 32 comprises a source 48, a drain 50, a control gate 52, and a floating gate 54. The floating gate 54 is separated from the source 48, the drain 50, and the substrate SB by a thin tunnel oxide 56. The source 48 is connected by a source electrode 58 to a source line AS such as the source line AS1 or AS2 in FIG. 2. The control gate 52 is connected by a control gate electrode 60 to a word line WL such as the word line WL1 or WL2 in FIG. 2. The drain 50 is contiguous with the source 36 of the select transistor 30.

The memory cell in FIG. 3 is said to be in the erased state when electrons have been injected into the floating gate 54, thus raising the threshold voltage of the storage transistor 32. The programmed state occurs when these electrons have been removed from the floating gate 54, lowering the threshold voltage.

A novel method of erasing the memory cells shown in FIGS. 2 and 3 will be described with reference to Table 1. This method, designated ERASE I in Table 1, simultaneously erases all the memory cells in one row: for example, in the second row as described below.

In Table 1 the first voltage, generated by the charge pump 4, is 14 V. This voltage is applied to the word line WL2 in the row to be erased, hence to the control gates 52 of the storage transistors 32 in that row.

The second voltage, generated by the negative charge pump 6, is −5 V. This voltage is applied to the substrate SB, and to all the source lines AS1, AS2, . . . , hence to the sources 48 of all the storage transistors 32.

The first word line WL1 and other word lines in rows not to be erased are placed at the ground level $V_{SS}$, shown as 0 V in Table 1. The select lines SL1, SL2, . . . are also grounded to 0 V, turning off all the select transistors 30 and disconnecting the storage transistors 32 from the bit lines BL1, BL2, . . . . The bit lines are allowed to float from an initial ground-level voltage (0 V).

Application of 14 V to the control gates 52 and −5 V to the substrate SB and sources 48 of the storage transistors 32 in the second row gives rise to a potential difference of 19 V across the floating gates 54 of these transistors, sufficient to cause electrons to tunnel from the source 48 and substrate SB through the tunnel oxide 56 into the floating gate 54. Thus the memory cells 21 and 22 and all other memory cells in the second row are erased.

In other rows, such as the first row comprising the memory cells 11 and 12, the potential difference across the floating gate 54 is only five volts. This is insufficient to cause tunnel current to flow. The memory contents of cells in these rows are therefore left unaltered.

Next a novel method of programming a particular memory cell will be described. As an example, the memory cell 21 in FIG. 2 will be programmed. The description will be confined to the four memory cells in FIG. 2, its extension to the entire memory cell array in FIG. 1 being obvious. The first and second voltages produced by the charge pump 4 and the negative charge pump 6 are 14 V and −5 V as before.

Referring to Table 1, in which the method is designated PROGRAM I, the first voltage (14 V) is applied to the bit line BL1 and the select line SL2, turning on the select transistors 30 in the second row. The second voltage (−5 V) is applied to all the word lines WL1, WL2, . . . , hence to the control gates 52 of all the storage transistors 32. The select line SL1 is grounded to 0 V, turning off the select transistors 30 in the first row. The substrate SB is also grounded. The bit line BL2 and the source lines AS1 and AS2 are allowed to float from an initial ground-level voltage.

In the memory cell 21, the select transistor 30 conducts the first voltage from the bit line BL1 to the drain 50 of the storage transistor 32. The first voltage is reduced from 14 V to substantially 13 V by passage through the select transistor 30, so substantially 13 V reaches the drain 50 of the storage transistor 32. Since the control gate 52 is at −5 V, this creates a potential difference of 18 V, which is still adequate to cause electrons to tunnel from the floating gate 54 to the drain 50, thus programming the memory cell 21.

In the memory cells 11 and 12, since the select transistor 30 is turned off, the drain 50 is in a floating state like that of the source 48. The potential difference between the control gate 52 and the substrate SB is only five volts, so no tunneling occurs and these memory cells are not programmed.

In the memory cell 22, the select transistor 32 is turned on but the bit line BL2 is floating, initially at 0 V. Again the potential difference across the floating gate 54 is only five volts, so no tunnel current flows and this memory cell is not programmed. The novel method PROGRAM I thus programs a particular memory cell without altering data in other memory cells.

In the above methods of erasing and programming, the maximum voltage difference between the source 36 and drain 40 of a select transistor 30 is 14 V (occurring in the memory cell 11 during programming of the memory cell 21, for example). The maximum voltage between the source 36 or drain 40 and substrate SB is likewise 14 V. The source-drain breakdown voltage $VB_{SD}$ and source/drain-junction breakdown voltage $VB_{SDJ}$ of the select transistors 30 accordingly need only be equal to or greater than 14 V. (The source-drain breakdown voltage $V_{SD}$ is a breakdown voltage between the source and drain. The source/drain-junction breakdown voltage $V_{SDJ}$ is a breakdown voltage of the pn junction between the source or drain and the channel or the substrate.) $VB_{SD}$ and $VB_{SDJ}$ can and preferably should be less than the potential difference between the first and second voltages. Select transistors employed in the prior art, by contrast, had to withstand this full potential difference, e.g. 20 V.

As a result of these reduced breakdown voltages, the novel method enables the gates 38 of the select transistors 30 to be shorter than in the prior art, the gate oxides 42 to be thinner, and the sources 36 and drains 40 to be less deep. All of these factors contribute to making the select transistors smaller and easier to fabricate.

Similarly, although not shown in the drawings, the driver transistors that supply the erasing and programming voltages to the bit lines and word lines can be smaller than in the prior art. Overall the novel methods require fewer types of transistors, allow the fabrication process to be shortened and reduced in cost, and enable higher levels of integration to be reached than in the prior art.

The novel erasing and programming methods described above can be modified in various ways without departing from the spirit and scope of the invention. For example, Table 2 illustrates two alternative methods of erasing the memory cells 21 and 22 in FIG. 2.

In the method designated ERASE II in Table 2, the first voltage (14 V) is applied to the word line WL2 and the select line SL2, the second voltage (−5 V) is applied to the bit lines BL1 and BL2 and the substrate SB, the first select line SL1 and the first word line WL1 are grounded, and the source lines AS1 and AS2 are allowed to float. The select transistors 30 in the memory cells 21 and 22 turn on, conducting a voltage substantially equal to −5 V to the drains 50 of the storage transistors 32 in these memory cells. Since the control gates 52 of the storage transistors 32 in the memory cells 21 and 22 are at 14 V and the substrate SB and drains 50 are at substantially −5 V, electrons tunnel from the substrate SB and drains 50 into the floating gates 54.

The method designated ERASE III in Table 2 is identical to ERASE II except that the second voltage (−5 V) is also applied to the source lines AS1 and AS2. Electrons therefore tunnel from the substrate SB and the sources 48 and drains 50 into their floating gates 54 of the memory cells 21 and 22.

If the source lines in the memory cell array are disposed in the column direction, the programming method can be similarly modified, as will be illustrated with reference to FIG. 4 and Table 3.

Figure 4:
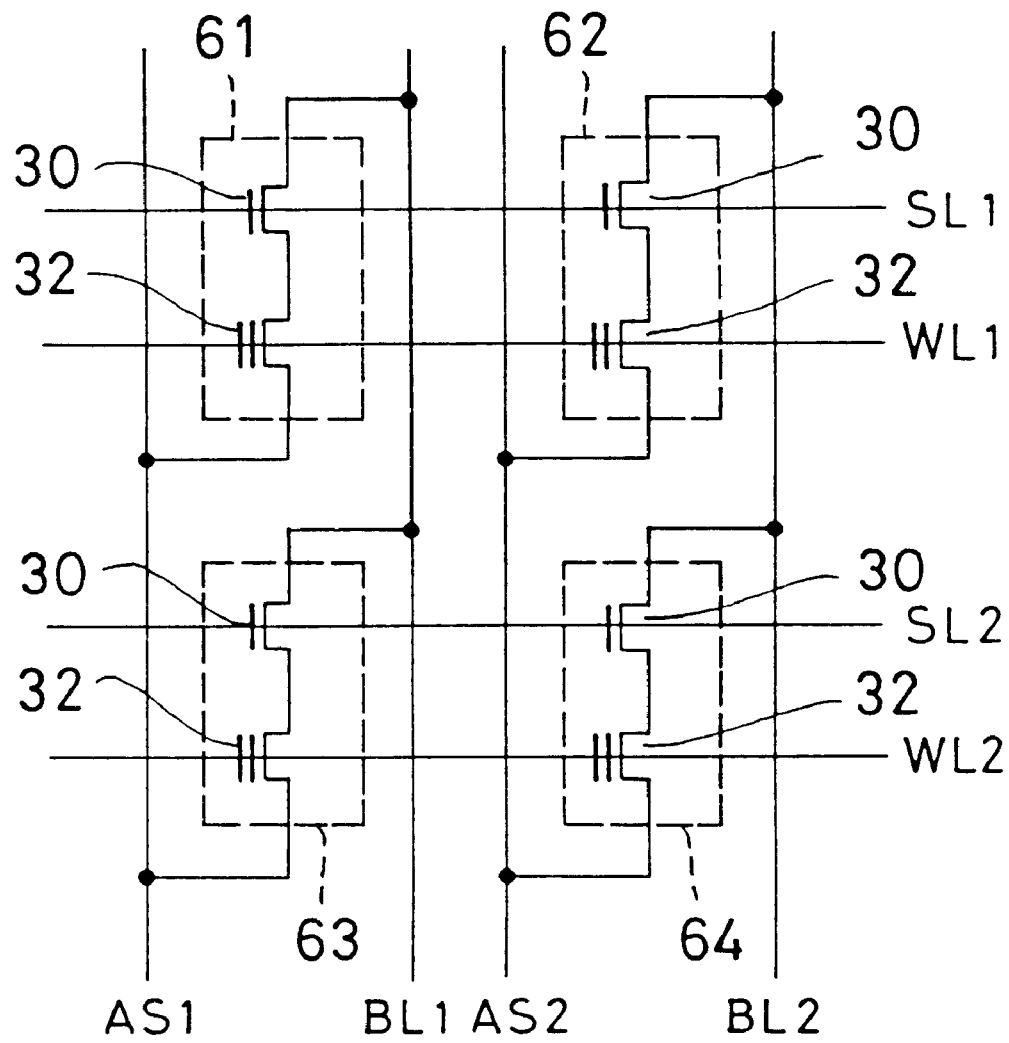
FIG. 4 is a schematic diagram of a modified memory cell array.

FIG. 4 shows four memory cells 61, 62, 63, and 64 in a modified memory cell array in which word lines WL1, WL2, . . . and select lines SL1, SL2, . . . run in the row direction, and bit lines BL1, BL2, . . . and source lines AS1, AS2, . . . run in the column direction. Each memory cell comprises a select transistor 30 and a storage transistor 32 having the structure shown in FIG. 3, connected in series between a bit line and a source line.

In the programming method designated PROGRAM II in Table 3, the first voltage (14 V) is applied to the source line AS1 and the second voltage (−5 V) is applied to the word line WL2. The supply voltage (5 V) is applied to the first word line WL1. The select lines SL1 and SL2 and the substrate SB are grounded (0 V). The bit lines BL1 and BL2 and the source line AS2 are allowed to float. In the storage transistor 32 of the memory cell 63, the potential difference between the control gate 52 and the source 48 is 19 V, causing electrons to tunnel from the floating gate 54 to the source 48, thus programming the memory cell. Other memory cells are not programmed.

The programming method designated PROGRAM III is the same as the programming method PROGRAM II except that the first voltage (14 V) is also applied to the second select line SL2 and the first bit line BL1. In the storage transistor 32 of the memory cell 63, the potential difference between the control gate 52 and both the source 48 and drain 50 is 19 V, causing electrons to tunnel from the floating gate 54 to both the source 48 and the drain 50.

In programming methods PROGRAM II and PROGRAM III the storage transistor 32 of the memory cell 61 experiences a potential difference of nine volts between its control gate 52 and source 48. This is greater than in PROGRAM I, but still not so high as to generate unwanted tunnel current.

A row of memory cells in the memory cell array in FIG. 4 can be erased by any of the methods ERASE I, ERASE II, and ERASE III illustrated in Table 1 and Table 2.

The modified methods illustrated in Table 2 and Table 3 give the same results and advantages as the methods in Table 1. Methods ERASE III and PROGRAM III enable the erasing time and programming time to be shortened by allowing additional tunnel current to flow.

A further modification can be made by removing the select transistors 30 in FIG. 4 and connecting the drains 50 of the storage transistors 32 directly to the bit lines BL1, BL2, . . . . Erasing and programming can still be carried out by applying voltages as in Table 2 and Table 3 to the word lines, bit lines, and source lines. The invention can thus be applied to EEPROMs with single-transistor memory cells, to reduce the size of their bit-line and word-line driving circuits.

Flash EEPROMs with single-transistor memory cells have been widely employed in the past due to their intrinsically smaller memory cell size. These EEPROMs have generally been erased by removing electrons from their floating gates, and programmed by injecting electrons into the floating gates. The novel methods described above can be adapted to such EEPROMs by reversing the roles of the first and second voltages: in erasing, the second voltage is applied to the control gate and the first voltage to the source and/or drain; in programming, the first voltage is applied to the control gate and the second voltage to the source and/or drain.

It is precisely in such single-transistor EEPROMs, however, that the problem of overerasing occurs. The analogous phenomenon in the EEPROMs in FIG. 2 and FIG. 4 is overprogramming; that is, programming a memory cell that is already in the programmed state, thereby so depleting its floating gate of electrons that the storage transistor has a negative threshold voltage and is always in the on-state.

Overprogramming is not a problem in the EEPROMs in FIG. 2 and FIG. 4, however. When an overprogrammed memory cell is read it will of course produce current on the bit line, indicating that it is in the programmed state. When another memory cell on the same bit line is read, the select transistor in the overprogrammed memory cell will be switched off, isolating the overprogrammed memory cell from the bit line so that the overprogrammed memory cell does not produce false current on the bit line. A merit of the present invention is that it enables select transistors to be used to avoid such problems as overerasing and overprogramming, and at the same time enables high integration densities to be attained because the select transistors can be smaller than in the prior art.

Table 4 illustrates another possible modification of the erasing methods described so far. This method can be implemented with the circuit of FIG. 2. In this method, designated ERASE IV, the first voltage generated by the charge pump 4 is 19 V, which is applied to the word line WL2. The source lines AS1, AS2, . . . , and the substrate SB are grounded to 0 V. 5 V is applied to the first word line WL1 and all select lines SL1, SL2, . . . , and the bit lines BL1, BL2, . . . are allowed to float. This method is similar to method ERASE I except that the voltages that produce tunneling have all been raised by five volts. That is, the voltages applied to the word line WL2, the source lines AS1 and AS2, and the substrate SB are all five volts higher than in method ERASE I in Table 1.

An advantage of method ERASE IV is that substrate biasing is extremely simple; the substrate need only be connected to the external ground. A larger driver circuit is needed to supply 19 V to the word line WL2, but the source-drain potential difference and source/drain-substrate potential difference in the select transistors is zero, so small select transistors can be employed, just as with the erasing methods of Table 1 and Table 2.

In Table 4 the first voltage, applied to the control gate, is 19 V while the second voltage, applied to the source and substrate, is 0 V, but these values can of course be modified. In general, the first voltage can be any voltage greater (higher) than a certain reference voltage (in this case 5 V) generated from the external supply voltage and external ground voltage. The second voltage can be any voltage less (lower) than the reference voltage, provided the potential difference between the first and second voltages is sufficient to cause tunneling to occur. To simplify substrate biasing, the second voltage is preferably equal to or greater (higher) than the ground voltage.

The first voltage (14 V) in Table 1 corresponds to the difference between the first voltage (19 V) and the reference voltage (5 V) in Table 4; the second voltage (−5 V) in Table 1 corresponds to the difference between the second voltage (0 V) and the reference voltage (5 V) in Table 4. Regarding breakdown voltages, the condition that the first voltage in Table 1 be equal to or less than $VB_{SD}$ becomes the condition:

first voltage−reference voltage≦$VB_{SD}$, or first voltage≦reference voltage+$VB_{SD}$.

Likewise, the condition that the first voltage in Table 1 be equal to or less than $VB_{SDJ}$ becomes the condition:

first voltage≦reference voltage+$VB_{SDJ}$.

The condition that $VB_{SD}$ and $VB_{SDJ}$ be less than the potential difference between the first and second voltages is:

$VB_{SD}$<first voltage−second voltage, and $VB_{SDJ}$<first voltage−second voltage, or second voltage<first voltage−$VB_{SD}$, and second voltage<first voltage−$VB_{SDJ}$.

For implementing the modifications of the erasing and programming methods, the driver circuit DRV in FIG. 1 needs to be modified, but the manner of modification will be obvious to those skilled in the art and will not be described in detail.

It will be apparent to one skilled in the art that still further modifications can be made without departing from the spirit and scope of the present invention. For example, instead of erasing one row at a time, a group of two or more rows can be erased simultaneously by supplying the first voltage to their word lines. Alternatively, the entire memory cell array can be erased at once by supplying the first voltage to the control gates of all memory cells using, for example, a bias circuit comprising only p-channel transistors, or a special high-voltage driving circuit. The invention is also applicable to EEPROMs that are modified a byte at a time by reading all memory cells on a word line, erasing the word line, then writing new data in eight memory cells on the word line and simultaneously rewriting the old data in the other memory cells on the word line.

In FIG. 3 the thin tunnel oxide 56 is disposed beneath the entire floating gate 54, but the invention is also applicable to EEPROMs in which a tunnel oxide is disposed only beneath part of the floating gate: for example, between the floating gate and the drain.

TABLE 1

|  | WL1 | WL2 | SL1 | SL2 | BL1 | BL2 | AS1 | AS2 | SB |
|---|---|---|---|---|---|---|---|---|---|
| ERASE I | 0 V | 14 V | 0 V | 0 V | FL | FL | −5 V | −5 V | −5 V |
| PROGRAM I | −5 V | −5 V | 0 V | 14 V | 14 V | FL | FL | FL | 0 V |

FL: Float

TABLE 2

|  | WL1 | WL2 | SL1 | SL2 | BL1 | BL2 | AS1 | AS2 | SB |
|---|---|---|---|---|---|---|---|---|---|
| ERASE II | 0 V | 14 V | 0 V | 14 V | −5 V | −5 V | FL | FL | −5 V |
| ERASE III | 0 V | 14 V | 0 V | 14 V | −5 V | −5 V | −5 V | −5 V | −5 V |

FL: Float

TABLE 3

| | WL1 | WL2 | SL1 | SL2 | BL1 | BL2 | AS1 | AS2 | SB |
|---|---|---|---|---|---|---|---|---|---|
| PROGRAM II | 5 V | −5 V | 0 V | 0 V | FL | FL | 14 V | FL | 0 V |
| PROGRAM III | 5 V | −5 V | 0 V | 14 V | 14 V | FL | 14 V | FL | 0 V |

FL: Float

TABLE 4

| | WL1 | WL2 | SL1 | SL2 | BL1 | BL2 | AS1 | AS2 | SB |
|---|---|---|---|---|---|---|---|---|---|
| ERASE IV | 5 V | 19 V | 5 V | 5 V | FL | FL | 0 V | 0 V | 0 V |

FL: Float

What is claimed is:

1. A method of erasing a data of an EEPROM memory cell supplied with a supply voltage and a ground voltage, the EEPROM memory cell comprising a storage transistor including a substrate having a first conductivity type and provided therein with a source and a drain each of a second conductivity type, a floating gate disposed over the substrate and a control gate disposed over the floating gate, said method comprising steps of:
applying a first voltage higher than both the supply voltage and the ground voltage to the control gate; and
applying a second voltage lower than both the supply voltage and the ground voltage to at least one of the source and drain while the first voltage is applied to the control gate, whereby electrons are injected into the floating gate when both the first and second voltages are applied.

2. The method of claim 1, wherein said substrate is biased to a voltage equal to or higher than said second voltage.

3. The method of claim 1, wherein a potential difference between said first and second voltages is sufficient to cause electrons to tunnel into said floating gate.

4. The method of claim 1, wherein said memory cell also comprises a select transistor connected in series with said storage transistor, said select transistor also has a source and a drain, and said select transistor has a source-drain breakdown voltage equal to or greater than said first voltage, and a potential difference between said first voltage and said second voltage is greater than said source-drain breakdown voltage.

5. The method of claim 1, wherein said memory cell additionally comprises a select transistor connected in series with said storage transistor, said select transistor has a source and a drain and a source/drain-junction breakdown voltage equal to or greater than said first voltage, and a potential difference between said first voltage and said second voltage is larger than said source/drain-junction breakdown voltage.

6. The method of claim 1, wherein said method further comprises the steps of:
generating said first voltage from said supply voltage and said ground voltage; and
generating said second voltage from said supply voltage and said ground voltage.

7. The method of claim 1, wherein said memory cell additionally comprises a select transistor connected in series with said storage transistor, said select transistor has a source and a drain, and a source-drain breakdown voltage and a source/drain-junction breakdown voltage, and the source-drain breakdown voltage of the select transistor and the source/drain-junction breakdown voltage of the select transistor are each less than the potential difference between the first and second voltages.

8. The method of claim 1, and further including reading data from said memory cell by applying the supply voltage to the control gate and applying the ground to one of the source and drain during the reading of the data from the memory cell.

9. A method of selectively erasing data in an EEPROM including a memory cell array having a plurality of memory cells supplied with a supply voltage and a ground voltage, each memory cell comprising a storage transistor including a substrate having a first conductivity type and provided therein with a source and a drain each of a second conductivity type, a floating gate disposed over the substrate and a control gate disposed over the floating gate, said method comprising steps of:
applying a first voltage higher than both the supply voltage and the ground voltage to the control gate of a selected memory cell;
applying a second voltage lower than both the supply voltage and the ground voltage to at least one of the source and drain of the selected memory cell while the first voltage is applied to the control gate, whereby electrons are injected into the floating gate when both the first and second voltages are applied; and
applying the ground voltage to at least one of the source and drain of a non-selected memory cell.

10. The method of claim 9, wherein said substrate is biased to a voltage equal to or higher than said second voltage.

11. The method of claim 9, wherein a potential difference between said first and second voltages is sufficient to cause electrons to tunnel into said floating gate.

12. The method of claim 9, wherein each memory cell also comprises a select transistor connected in series with said storage transistor, said select transistor also has a source and a drain, and said select transistor has a source-drain breakdown voltage equal to or greater than said first voltage, and a potential difference between said first voltage and said second voltage is greater than said source-drain breakdown voltage.

13. The method of claim 9, wherein each memory cell additionally comprises a select transistor connected in series with said storage transistor, said select transistor has a source and a drain and a source/drain-junction breakdown voltage equal to or greater than said first voltage, and a potential difference between said first voltage and said second voltage is larger than said source/drain-junction breakdown voltage.

14. The method of claim 9, wherein said method further comprises the steps of:
generating said first voltage from said supply voltage and said ground voltage; and
generating said second voltage from said supply voltage and said ground voltage.

15. The method of claim 9, wherein each memory cell additionally comprises a select transistor connected in series with said storage transistor, said select transistor has a source and a drain, and a source-drain breakdown voltage and a source/drain-junction breakdown voltage, and the source-drain breakdown voltage of the select transistor and the source/drain-junction breakdown voltage of the select transistor are each less than the potential difference between the first and second voltages.

16. A method of injecting electrons into a floating gate of a storage transistor of an EEPROM memory cell supplied with a supply voltage and a ground voltage, wherein the storage transistor comprises a substrate of a first conductivity type provided therein with a source and a drain each of a second conductivity type, the floating gate being disposed over the substrate, and further including a control gate disposed over the floating gate, said method comprising steps of:

applying a first voltage higher than both the supply voltage and the ground voltage to the control gate; and applying a second voltage lower than both the supply voltage and the ground voltage to at least one of the source and drain while the first voltage is applied to the control gate, whereby electrons are injected into the floating gate when both the first and second voltages are applied.

17. The method of claim 16, including biasing the substrate to a voltage equal to or higher than the second voltage.

18. The method of claim 16, including making the potential difference between the first and second voltages sufficient to cause electrons to tunnel into the floating gate.

19. The method of claim 16, wherein the memory cell further comprises a select transistor connected in series with the storage transistor, the select transistor including a source and a drain, and having a source-drain breakdown voltage equal to or greater than the first voltage, with a potential difference between the first voltage and the second voltage being greater than the source-drain breakdown voltage.

20. The method of claim 16, wherein the memory cell further comprises a select transistor connected in series with the storage transistor, the select transistor having a source and a drain and a source/drain-junction breakdown voltage equal to or greater than the first voltage, with a potential difference between the first voltage and the second voltage being larger than the source/drain-junction breakdown voltage.

21. The method of claim 16, further comprising steps of:

generating the first voltage from the supply voltage and the ground voltage; and generating the second voltage from the supply voltage and the ground voltage.

22. The method of claim 16, wherein the memory cell additionally comprises a select transistor connected in series with the storage transistor, the select transistor has a source and a drain, and a source-drain breakdown voltage and a source/drain-junction breakdown voltage, and the source-drain breakdown voltage of the select transistor and the source/drain-junction breakdown voltage of the select transistor are each less than a potential difference between the first and second voltages.

23. The method of claim 16, and further including reading data from said memory cell by applying the supply voltage to the control gate and applying the ground to one of the source and drain during the reading of the data from the memory cell.

24. A method of selectively injecting electrons into a floating gate of a storage transistor of a memory cell in an EEPROM memory cell array having a plurality of memory cells supplied with a supply voltage and a ground voltage, wherein the storage transistor comprises a substrate of a first conductivity type provided therein with a source and a drain each of a second conductivity type, the floating gate being disposed over the substrate, and further including a control gate disposed over the floating gate, said method comprising steps of:

applying a first voltage higher than both the supply voltage and the ground voltage to the control gate of a selected memory cell;

applying a second voltage lower than both the supply voltage and the ground voltage to at least one of the source and drain of the selected memory cell while the first voltage is applied to the control gate, whereby electrons are injected into the floating gate when both the first and second voltages are applied; and applying the ground voltage to at least one of the source and drain of a non-selected memory cell.

25. The method of claim 24, including biasing the substrate to a voltage equal to or higher than the second voltage.

26. The method of claim 24, including making the potential difference between the first and second voltages sufficient to cause electrons to tunnel into the floating gate.

27. The method of claim 24, wherein each memory cell further comprises a select transistor connected in series with the storage transistor, the select transistor including a source and a drain, and having a source-drain breakdown voltage equal to or greater than the first voltage, with a potential difference between the first voltage and the second voltage being greater than the source-drain breakdown voltage.

28. The method of claim 24, wherein each memory cell further comprises a select transistor connected in series with the storage transistor, the select transistor having a source and a drain and a source/drain-junction breakdown voltage equal to or greater than the first voltage, with a potential difference between the first voltage and the second voltage being larger than the source/drain-junction breakdown voltage.

29. The method of claim 24, further comprising steps of:

generating the first voltage from the supply voltage and the ground voltage; and generating the second voltage from the supply voltage and the ground voltage.

30. The method of claim 24, wherein each memory cell additionally comprises a select transistor connected in series with the storage transistor, the select transistor has a source and a drain, and a source-drain breakdown voltage and a source/drain-junction breakdown voltage, and the source-drain breakdown voltage of the select transistor and the source/drain-junction breakdown voltage of the select transistor are each less than a potential difference between the first and second voltages.

* * * * *